United States Patent
Gean et al.

(10) Patent No.: US 10,154,149 B1
(45) Date of Patent: Dec. 11, 2018

(54) AUDIO FRAMEWORK EXTENSION FOR ACOUSTIC FEEDBACK SUPPRESSION

(71) Applicant: MOTOROLA SOLUTIONS, INC., Chicago, IL (US)

(72) Inventors: Nissim Gean, Netanya (IL); Bar Yamin, Mazkeret Batya (IL); Avner Carmeli, Hod Hasharon (IL); Pavel Livshits, Modiyin (IL)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 0 days.

(21) Appl. No.: 15/922,660

(22) Filed: Mar. 15, 2018

(51) Int. Cl.
*H04B 1/38* (2015.01)
*H04M 9/08* (2006.01)
*H03G 3/32* (2006.01)
*H04R 3/04* (2006.01)

(52) U.S. Cl.
CPC .............. *H04M 9/085* (2013.01); *H03G 3/32* (2013.01); *H04R 3/04* (2013.01)

(58) Field of Classification Search
CPC ............ H04M 9/085; H03G 3/32; H04R 3/04
USPC .......................................................... 455/570
See application file for complete search history.

(56) References Cited

U.S. PATENT DOCUMENTS

| | | | | |
|---|---|---|---|---|
| 6,741,874 B1* | 5/2004 | Novorita | ............... | H04M 9/082 370/282 |
| 8,600,299 B2* | 12/2013 | Randall | ................ | A61B 8/4483 128/916 |
| 9,667,284 B1* | 5/2017 | Gean | ....................... | H04W 4/10 |
| 9,741,359 B2* | 8/2017 | Cheung | .................. | H04R 1/403 |
| 2002/0172374 A1* | 11/2002 | Bizjak | .................. | H03G 3/3089 381/71.14 |
| 2005/0046584 A1* | 3/2005 | Breed | ..................... | B60C 11/24 340/13.31 |
| 2005/0113948 A1* | 5/2005 | Own | ................ | G11B 20/10527 700/94 |
| 2006/0136544 A1* | 6/2006 | Atsmon | .................... | A63H 3/28 709/200 |

(Continued)

FOREIGN PATENT DOCUMENTS

CN 104157292 11/2014

*Primary Examiner* — April G Gonzales
(74) *Attorney, Agent, or Firm* — Michael Best & Friedrich LLP

(57) ABSTRACT

An audio framework for acoustic feedback suppression. One example portable communication device includes a microphone, a loudspeaker, and an electronic processor. The electronic processor receives an acoustic signal, including an audible component and an ultrasonic component, from the microphone. The electronic processor splits the acoustic signal into a first stream and a second stream identical to the first stream. The electronic processor is removes the ultrasonic component from the first stream to generate a filtered audio stream, and passes the filtered audio stream to a sound server. The electronic processor removes the audible component from the second stream to generate a received ultrasonic stream, and compares the received ultrasonic stream to a transmit ultrasonic stream to determine an acoustic distance. The electronic processor determines an attenuation level based on the acoustic distance, and adjusts an audio component of the portable communication device based on the attenuation level.

18 Claims, 5 Drawing Sheets

(56) References Cited

U.S. PATENT DOCUMENTS

| | | | |
|---|---|---|---|
| 2006/0177045 A1* | 8/2006 | Thomas | H04M 3/567 379/399.01 |
| 2009/0067291 A1* | 3/2009 | Atsmon | A63H 3/28 367/118 |
| 2009/0215439 A1* | 8/2009 | Hamilton | H04M 1/605 455/418 |
| 2010/0030838 A1* | 2/2010 | Atsmon | A63H 3/28 709/200 |
| 2010/0151787 A1* | 6/2010 | Contreras | H04B 1/44 455/41.2 |
| 2011/0110532 A1* | 5/2011 | Svendsen | H04M 9/082 381/93 |
| 2011/0182445 A1* | 7/2011 | Atsmon | A63H 3/28 381/123 |
| 2011/0264391 A1* | 10/2011 | McGoogan | G01H 1/003 702/66 |
| 2012/0295562 A1* | 11/2012 | Sorensen | H03G 3/3089 455/127.2 |
| 2014/0088975 A1* | 3/2014 | Davis | G08C 23/02 704/500 |
| 2015/0016632 A1* | 1/2015 | Hillis | H04R 3/04 381/98 |
| 2015/0119067 A1* | 4/2015 | Lavery | H04W 64/003 455/456.1 |
| 2016/0094960 A1* | 3/2016 | Wong | H04W 4/10 370/277 |
| 2016/0174003 A1* | 6/2016 | Kappus | H04R 29/00 381/58 |
| 2018/0018988 A1* | 1/2018 | Cheung | H04R 1/403 |

* cited by examiner

AUDIO FRAMEWORK EXTENSION FOR ACOUSTIC FEEDBACK SUPPRESSION

BACKGROUND OF THE INVENTION

In the course of performing their duties, public safety personnel may use cellular or converged wireless devices to communicate with one another. Such devices often provide half-duplex push-to-talk (PTT) communications, which may experience problems when a receiving device is in proximity to a transmitting device. For example, a microphone of the transmitting device may pick up sounds emitted by a speaker of the receiving device. This causes acoustic feedback, which can continue to circulate between the devices, growing into an unstable loop. This unstable loop is known as howling. When howling occurs, desired communications are often drowned out or otherwise obfuscated.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
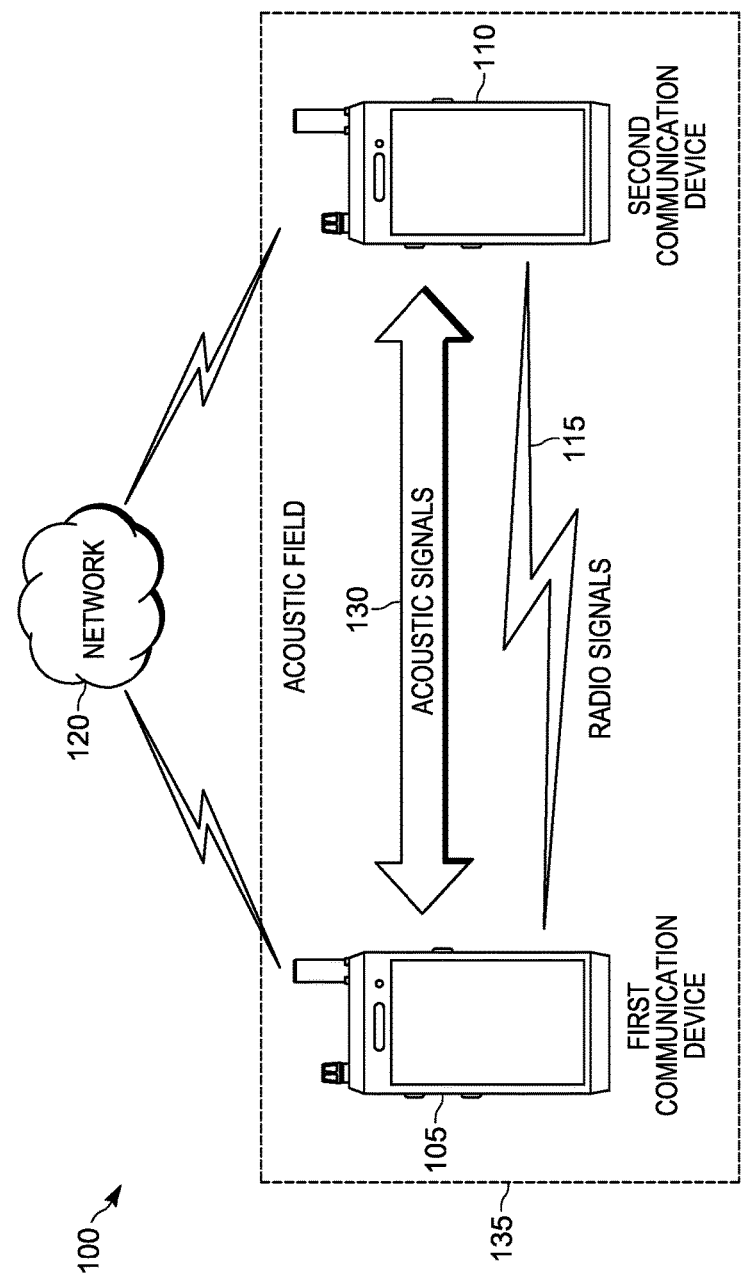
FIG. 1 is a diagram of a communication system, in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

As noted, the use of push-to-talk audio communication devices near one another may cause acoustic feedback loops known as howling. To stop a howling condition, the feedback loop must be broken. One approach to stopping a howling condition is to reduce or eliminate the audio feedback source. For example, the distance between the transmitting device and the source of the audio feedback could be increased until the sound level from the audio feedback source at a microphone in the transmitting device is reduced below a level where the microphone generates a discernable output. However, this may not be possible when the users of both devices need to work in proximity to one another (for example, when public safety personnel are responding to an emergency situation). To address these problems, some devices suppress howling by automatically lowering the volume of their speakers, to reduce the possibility of generating audio feedback.

One method is to use a set of proximity thresholds and the distance between the transmitting and receiving devices to identify howling sources and automatically suppress howling. The distance between the devices is compared to the thresholds, and an appropriate mitigation action (for example, turning down a loudspeaker volume or adjusting a microphone sensitivity) is taken based on the comparison. A single set of predefined proximity thresholds may be used, or the proximity thresholds may be adapted to the current acoustic environment of the devices to dynamically suppress howling. The methods use ultrasonic transmissions from the communication devices to, among other things, calculate distance between devices, identify howling sources, and make determinations about the acoustic environment.

In some communication devices (for example, those running the Android® mobile operating system developed by Google, LLC), the automated howling suppression solutions must be implemented as part of a shared audio framework. In such devices, the automated howling suppression solution is therefore common to all push-to-talk clients. However, such audio frameworks do not allow for listening to audio resources, such as audio streams, by other applications. For example, the audio input/output of a voice over IP call are resources which cannot be accessed by another application or service, and cannot be used in parallel for background analysis, storage, or the like. Furthermore, ultrasonic proximity detection requires separate gains and filters for ultrasonic sounds (that is, separate from those used for the audible sounds). Accordingly, embodiments presented herein provide, among other things, an audio framework extension for acoustic feedback suppression.

Embodiments presented herein extend the audio frameworks of communications devices by mirroring audio streams to provide for separate processing of audible (for example, voice) and ultrasonic signals. Using such embodiments, communication devices equipped with automated howling suppressors are able to access and manipulate the audio streams of push-to-talk client applications. In addition, example automated howling suppressors presented herein are able to adjust gains of both audible and ultrasonic signals and suppress howling, without compromising the secure architecture of the operating system.

One example embodiment provides a portable communication device. The device includes a microphone, a loudspeaker, and an electronic processor coupled to the microphone and the loudspeaker. The electronic processor is configured to receive an acoustic signal from the microphone. The acoustic signal includes an audible component and an ultrasonic component. The electronic processor is configured to split the acoustic signal into a first stream and a second stream identical to the first stream. The electronic processor is configured to remove the ultrasonic component from the first stream to generate a filtered audio stream. The electronic processor is configured to pass the filtered audio stream to a sound server. The electronic processor is configured to remove the audible component from the second stream to generate a received ultrasonic stream. The electronic processor is configured to compare the received ultrasonic stream to a transmit ultrasonic stream to determine an acoustic distance. The electronic processor is configured to determine an attenuation level based on the acoustic distance. The electronic processor is configured to adjust an audio component of the portable communication device based on the attenuation level.

Another example embodiment provides a method for providing acoustic feedback suppression in a portable communication device. The method includes receiving an acoustic signal from a microphone of the portable communication device. The acoustic signal includes an audible component and an ultrasonic component. The method includes splitting, with an electronic processor, the acoustic signal into a first stream and a second stream identical to the first stream. The method includes removing the ultrasonic component from the first stream to generate a filtered audio stream. The method includes passing the filtered audio stream to a sound server of the portable communication device. The method includes removing the audible component from the second stream to generate a received ultrasonic stream. The method includes comparing the received ultrasonic stream to a transmit ultrasonic stream to determine an acoustic distance. The method includes determining an attenuation level based on the acoustic distance. The method includes adjusting an audio component of the portable communication device based on the attenuation level.

For ease of description, some or all of the example systems presented herein are illustrated with a single exemplar of each of its component parts. Some examples may not describe or illustrate all components of the systems. Other example embodiments may include more or fewer of each of the illustrated components, may combine some components, or may include additional or alternative components.

FIG. 1 illustrates an example communication system 100. The communication system 100 includes a first communication device 105 and a second communication device 110. The first communication device 105 and the second communication device 110, both described more particularly below with respect to FIG. 2, transmit and receive voice and data to each other and to other communication devices (not shown) using radio signals 115. In some embodiments, the first communication device 105 and the second communication device 110 are communicatively coupled via a network 120. The network 120 is an electronic communications network including wireless and wired connections. The network 120 may be implemented using a wide area network, for example, the Internet, a local area network, for example, a Bluetooth™ network or Wi-Fi, a Long Term Evolution (LTE) network, a Global System for Mobile Communications (or Groupe Spécial Mobile (GSM)) network, a Code Division Multiple Access (CDMA) network, an Evolution-Data Optimized (EV-DO) network, an Enhanced Data Rates for GSM Evolution (EDGE) network, a 3G network, a 4G network, a 5G network, and combinations or derivatives thereof. In some embodiments, the network 120 includes a land mobile radio (LMR) network. For ease of description, only two communication devices are illustrated in FIG. 1. Some embodiments of the communication system 100 include additional electronic communication devices, which may communicate directly, over the network 120, or both.

In some embodiments, the first communication device 105 and the second communication device 110 provide push-to-talk functionality. Push-to-talk is a method of transmitting audio communications over a half-duplex communication channel. In some embodiments, the network 120 includes hardware and software suitable for assigning the first communication device 105, the second communication device 110, other communication devices (not shown), or combinations thereof to one or more talk groups and facilitating communications therebetween. For example, the network 120 may, upon receiving a request from one of the communication devices, establish push-to-talk channels between two or more communication devices based on talk group identifiers, device identifiers, or both. In some embodiments, push-to-talk communications occurs between the communication devices without the involvement of the network 120.

In the embodiment illustrated in FIG. 1, the first communication device 105 and the second communication device 110 are handheld communication devices, for example, mobile telephones (including smart telephones), portable two-way radios, or converged devices including electronics, software, and other components sufficient to support both cellular and land mobile radio communications. In some embodiments, the first communication device 105 and the second communication device 110 are smart watches or other smart wearables, or other types of portable electronic devices configured to operate as described herein. The first communication device 105 and the second communication device 110 may be different types of communication devices, and both may alternatively be a mounted or stationary communication device, for example, a mobile computing device or a communication device installed in a vehicle. For example, in some embodiments, the first communication device 105 may be a handheld cellular telephone carried by public safety personnel, for example, police officers. The second communication device 110 may be a cellular communication device installed in a public safety vehicle, for example, a police vehicle. In another example, the first communication device 105 may be a smart telephone, and the second communication device 110 may be a tablet computer. Accordingly, the first communication device 105 and the second communication device 110 may be any type of communication device capable of communicating independent of or over the network 120 using push-to-talk communications, as described herein.

As described in more detail below, the first communication device 105 and the second communication device 110 also produce acoustic signals 130 from one or more loudspeakers (for example, audible signals, ultrasonic signals, or both). As illustrated in FIG. 1, the first communication device 105 and the second communication device 110 may operate within the same acoustic field 135. The acoustic field 135 is an area, within which the microphone of one of the communication devices is capable of detecting acoustic signals 130 produced by the loudspeaker of the other communication device.

As noted above, in some situations, when the first communication device 105 is in proximity to the second communication device 110 and the first communication device 105 is transmitting to the second communication device 110, the first communication device 105 may receive a feedback signal from the acoustic signal 130 produced by the second communication device 110. The feedback signal may continue to circulate and grow in an unstable loop leading to a phenomenon known as howling. Accordingly, as described in detail below, the first communication device 105 and the second communication device 110 include hardware and software configured to identify and suppress howling. Some methods for howling suppression are known, including the hardware and software illustrated and described in U.S. Pat. No. 9,667,284 ("METHOD, DEVICE, AND SYSTEM FOR IDENTIFYING A HOWLING SOURCE AND SUPPRESS- ING HOWLING"), issued May 30, 2017. In some embodiments, a combination of approaches to automated howling suppression is used.

Figure 2:
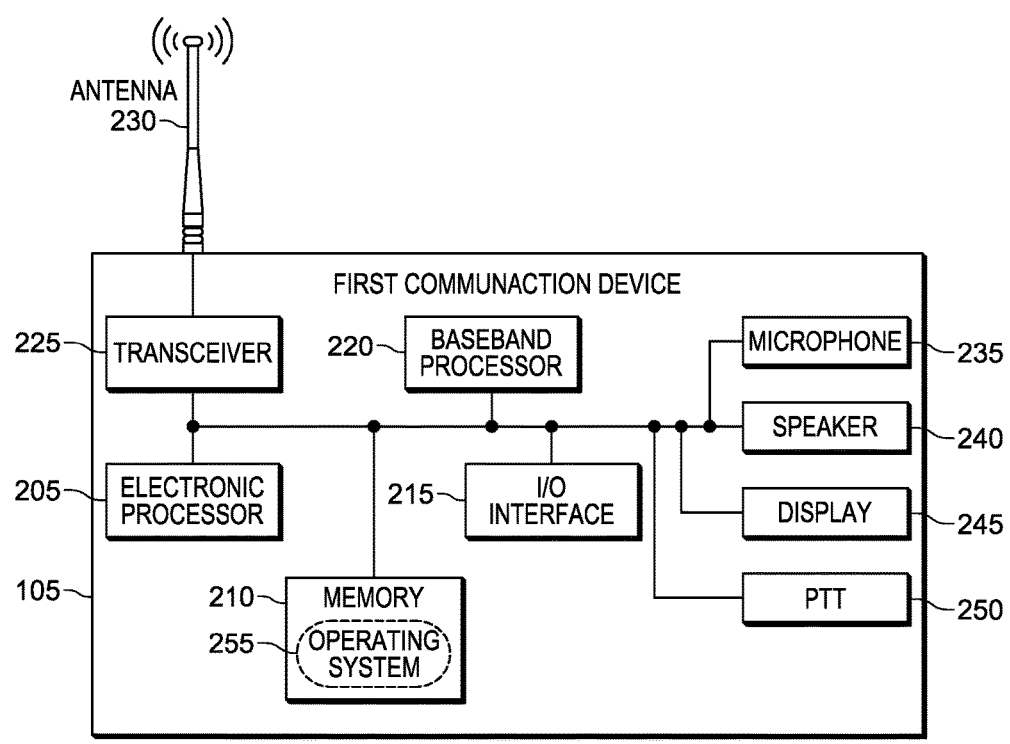
FIG. 2 is a diagram of a communication device included in the communication system of FIG. 1, in accordance with some embodiments.

FIG. 2 is a diagram of an example first communication device 105. In the embodiment illustrated, the first communication device 105 includes an electronic processor 205, a memory 210, an input/output interface 215, a baseband processor 220, a transceiver 225, an antenna 230, microphone 235, a loudspeaker 240, a display 245, and a push-to-talk (PTT) selection mechanism 250. The illustrated components, along with other various modules and components are coupled to each other by or through one or more electrical connections (for example, control or data buses) that enable communication therebetween. The use of such connections, including control and data buses, for the interconnection between and exchange of information among the various modules and components would be apparent to a person skilled in the art. In some embodiments, the first communication device 105 includes fewer or additional components in configurations different from that illustrated in FIG. 2. For example, in some embodiments, the first communication device 105 includes multiple microphones, multiple speakers, or combinations thereof.

The electronic processor 205 obtains and provides information (for example, from the memory 210 and/or the input/output interface 215), and processes the information by executing one or more software instructions or modules, capable of being stored, for example, in a random access memory ("RAM") area of the memory 210 or a read only memory ("ROM") of the memory 210 or another non-transitory computer readable medium (not shown). The software can include firmware, one or more applications, program data, filters, rules, one or more program modules, and other executable instructions. The electronic processor 205 is configured to retrieve from the memory 210 and execute, among other things, software related to the control processes and methods described herein. The memory 210 can include one or more non-transitory computer-readable media, and includes a program storage area and a data storage area. The program storage area and the data storage area can include combinations of different types of memory, as described herein. In the embodiment illustrated, the memory 210 stores, among other things, an operating system 255. In some embodiments, the operating system 255 is a version or derivative of the Android® mobile operating system (developed by Google, LLC).

The input/output interface 215 is configured to receive input and to provide system output. The input/output interface 215 obtains information and signals from, and provides information and signals to, (for example, over one or more wired and/or wireless connections) devices both internal and external to the first communication device 105.

The electronic processor 205 is configured to control the baseband processor 220 and the transceiver 225 to transmit and receive voice and other data to and from the second communication device 110. The baseband processor 220 encodes and decodes digital data sent and received by the transceiver 225. The transceiver 225 transmits and receives radio signals 115 to and from, for example, the network 120 using the antenna 230. The electronic processor 205, the baseband processor 220, and the transceiver 225 may include various digital and analog components, which for brevity are not described herein and which may be implemented in hardware, software, or a combination of both. Some embodiments include separate transmitting and receiving components, for example, a transmitter and a receiver, instead of a combined transceiver 225.

The microphone 235 is a transducer capable of sensing sound, converting the sound to electrical signals, and transmitting the electrical signals to the electronic processor 205. The electronic processor 205 processes the electrical signals received from the microphone 235 to produce an audio stream, which may be transmitted to other devices via the transceiver 225. The loudspeaker 240 is a transducer for reproducing sound from electrical signals (for example, generated from a received audio stream) received from the electronic processor 205. The microphone 235 and the loudspeaker 240 support both ultrasonic and audible frequencies. In some embodiments, the microphone 235 and the loudspeaker 240 have single transducers that support both ultrasonic and audible frequencies. Alternatively, in some embodiments, the microphone 235 and the loudspeaker 240 have separate transducers for ultrasonic and audible frequencies. In some embodiments, the microphone 235, the loudspeaker 240, or both may be integrated in a single housing with the other components (for example, in a converged device). In some embodiments, the microphone 235, the loudspeaker 240, or both are present in an accessory device (for example, a remote speaker microphone (RSM)) connected via a wired or wireless connection to the first communication device 105.

The display 245 is a suitable display, for example, a liquid crystal display (LCD) touch screen, or an organic light-emitting diode (OLED) touch screen. In some embodiments, the first communication device 105 implements a graphical user interface (GUI) (for example, generated by the electronic processor 205, using the operating system 255 stored in the memory 210, and presented on the display 245), that enables a user to interact with the first communication device 105.

The push-to-talk selection mechanism 250 allows a user of the first communication device 105 to initiate push-to-talk half-duplex voice communications to one or more other communication devices, either directly or over the network 120. For example, when the electronic processor 205 detects that the push-to-talk selection mechanism 250 is enabled, the electronic processor 205 controls the transceiver 225 to transmit signals created by sound detected by the microphone 235 (for example, as a half-duplex communication signal). When the electronic processor 205 detects that the push-to-talk selection mechanism 250 is no longer enabled (for example, has been released), the transceiver 225 stops transmitting the signals. In some embodiments, the push-to-talk selection mechanism 250 is a mechanical button, key, switch, or knob. In some embodiments, the push-to-talk selection mechanism 250 is provided as part of a graphical user interface (for example, a virtual button) presented on the display 245.

The second communication device 110 includes similar components as described above, and is configured similarly to the first communication device 105. In some embodiments, the first communication device 105 is identical to the second communication device 110.

In some situations, for example, when the first communication device 105 is operating in close proximity to the second communication device 110, a howling condition may develop. As noted above, in some embodiments, the first communication device 105, the second communication device 110, or both, are configured to detect and suppress howling using fixed or dynamic proximity thresholds. For example, as illustrated in FIG. 1, the first communication device 105 and the second communication device 110 are operating within the acoustic field 135. Sound waves produced by the voice of the user of the first communication device 105 are picked up by the microphone 235 of the first communication device 105 and encoded into transmittable signals, which are transmitted via the radio signals 115 to the second communication device 110. The second communication device 110 receives the signals, decodes them, and plays them as voice (that is, sound in the audible frequency range) audio through its loudspeaker (as acoustic signals 130). In some cases, the microphone 235 of the first communication device 105 may pick up the voice in the acoustic signals 130, encode the voice, and transmit it, which creates an audio feedback loop (a howling condition). Using automated howling suppression techniques referenced herein, the first communication device 105 may identify whether the second communication device 110 is a howling source (that is, an actual or current howling source or a potential howling source) based on the distance between the first communication device 105 and the second communication device 110.

In order to detect howling, or the potential for howling, each of the communication devices is configured to transmit and receive ultrasonic signals (for example, included in the acoustic signals 130) and to compare the received ultrasonic signals to the transmitted ultrasonic signals. For example, the devices may determine distances between one another by comparing the signal strengths of the transmitted and received signals, or by calculating the time of flight for the ultrasonic signals. In another example, a device may identify itself as a howling source by measuring the reflection pattern of the transmitted ultrasonic signals from another device. The communication devices may take one or more actions to suppress (for example, prevent, stop, or limit) howling associated with the howling source. For example, the sensitivity of a microphone may be reduced to limit picking up the audio feedback, or the volume of a speaker may be reduced to prevent the audio feedback from reaching a microphone.

Figure 3:
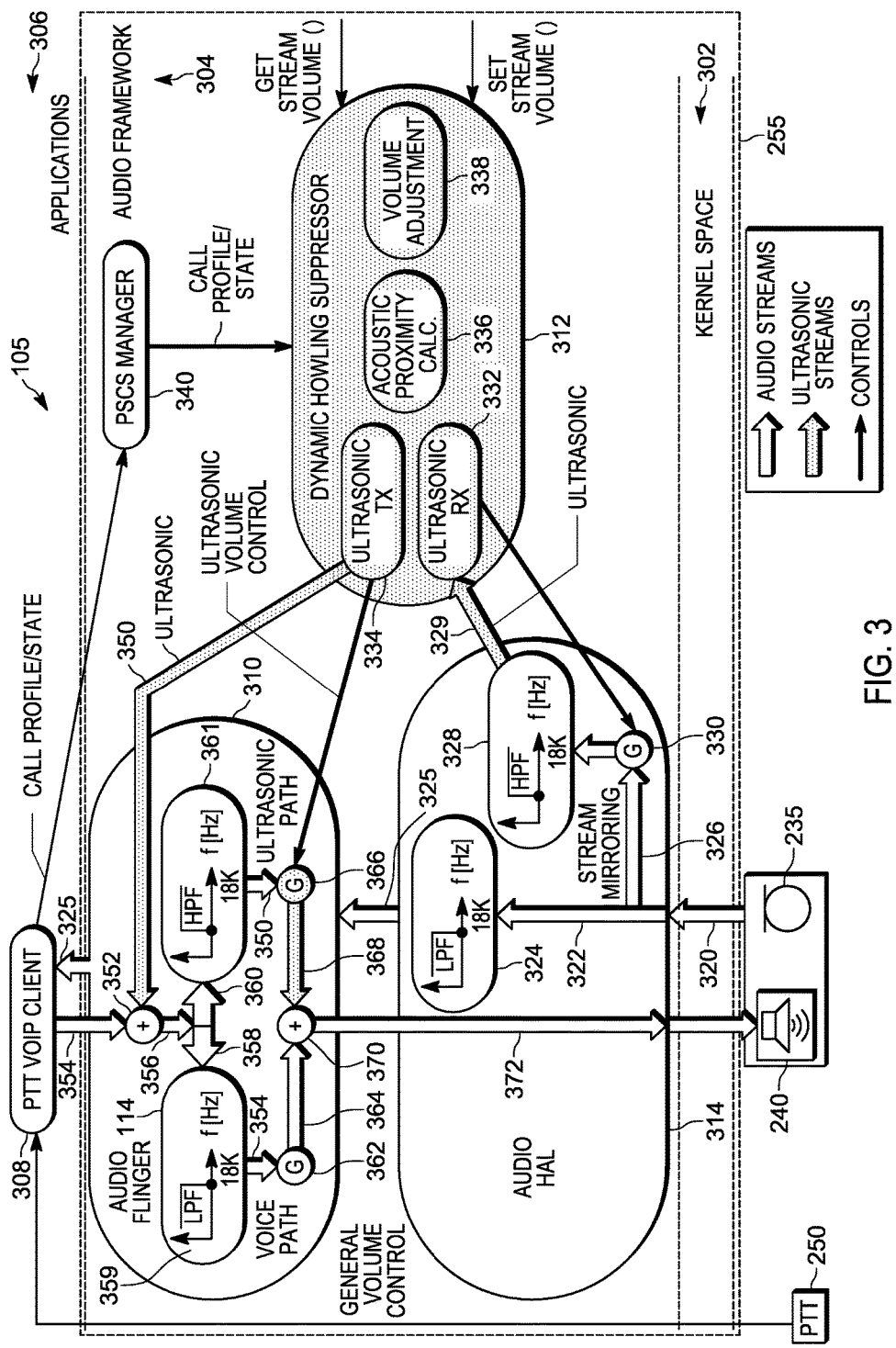
FIG. 3 is a diagram illustrating audio processing operations of the communication device of FIG. 2, in accordance with some embodiments.

As noted, in some communication devices (for example, the first communication device 105), the automated howling suppression solutions must be implemented as part of a shared audio framework. FIG. 3 is a diagram illustrating audio processing hardware and operations for the first communication device 105. For ease of description, FIG. 3 includes both functions (for example, the dynamic howling suppressor 312), which may be implemented in hardware and software, and hardware components (for example, the microphone 235 and the loudspeaker 240) of the first communication device 105. In one embodiment, the functions are implemented by the electronic processor 205 (for example, using software stored in the memory 210), hardware, or a combination of both.

The first communication device 105, as illustrated in FIG. 3, includes a microphone 235, a loudspeaker 240, and a push-to-talk mechanism 250 (all as described above), which are coupled to the operating system 255. The operating system 255 includes a kernel space 302 and an audio framework 304. Software applications that provide services to users of the first communication device 105 operate in an application framework 306, and interact with the audio framework 304 to access the microphone 235 and the loudspeaker 240. For example, a Push-to-talk voice over IP client 308 interacts with the audio framework 304, to send and receive voice communications using, among other things, the microphone 235 and the loudspeaker 240.

The operating system 255 operates the microphone 235 and the loudspeaker 240 using kernel device drivers (not shown) in the kernel space 302. The device drivers, and thus the microphone 235 and the loudspeaker 240, are accessed (for example, by the audio flinger 310 and the dynamic howling suppressor 312) via an audio hardware abstraction layer (HAL) 314.

The audio hardware abstraction layer 314 receives acoustic signals (for example, the acoustic signal 320) from the microphone 235. The acoustic signal 320 may include an audible component and an ultrasonic component. To enable processing of both components for howling suppression, the hardware abstraction layer 314 splits the acoustic signal into two identical streams (that is, the second stream is a duplicate of the first stream). The first stream 322 is passed through a low pass filter 324, which removes the ultrasonic component to generate a filtered audio stream 325. The filtered audio stream 325 is passed to the audio flinger 310, which passes the filtered audio stream 325 on to the Push-to-talk voice over IP client 308. The second stream 326 is passed through a high pass filter 328, which removes the audible component to generate a received ultrasonic stream 329. The received ultrasonic stream 329 is passed to the dynamic howling suppressor 312. In some embodiments, the audio hardware abstraction layer 314 includes a gain control 330 for adjusting the gain of the second stream 326, for example, based on control signals received from the dynamic howling suppressor 312.

The dynamic howling suppressor 312 implements automated howling suppression, as described herein. The dynamic howling suppressor 312 includes an ultrasonic receiver 332, for receiving ultrasonic signals (for example, the received ultrasonic stream 329) from the audio hardware abstraction layer 314. The dynamic howling suppressor 312 also includes an ultrasonic transmitter 334, for providing ultrasonic signals to the audio flinger 310. The dynamic howling suppressor 312 also includes an acoustic proximity calculator 336, which compares received ultrasonic signals to transmitted ultrasonic signals to make determinations used in automated howling suppression techniques. Finally, the dynamic howling suppressor 312 includes a volume adjustor 338, which sets a volume for the loudspeaker 240 (for example, based on determinations made by the acoustic proximity calculator 336) to reduce or eliminate howling. For example, the dynamic howling suppressor 312 may receive indications of the current output volume for the loudspeaker 240 (for example, in response to a getStreamVolume( ) system call) and make adjustments to the output volume for the loudspeaker 240 (for example, by making a setStreamVolume( ) system call) to suppress howling.

In some embodiments, the dynamic howling suppressor 312 receives indications of push-to-talk call states (for example, whether a push-to-talk call is being made or received by the first communication device 105) from a public safety communications system manager 340, which manages public safety communications functionality on the first communication device 105. The public safety communications system manager 340 receives push-to-talk call state indications from the Push-to-talk voice over IP client 308.

As noted above, the dynamic howling suppressor 312 provides a transmit ultrasonic stream 350 to the audio flinger 310. The audio flinger 310 is a sound server, which manages the access to and use of audio devices and resources in the first communication device 105. The audio flinger 310 includes a mixer 352, which mixes incoming audio signals from applications and system processes to produce audio output for the loudspeaker 240. For example, the Push-to-talk voice over IP client provides an audio stream 354, and system processes may provide audio alerts or other audio to the audio flinger 310 for broadcast over the loudspeaker 240.

When the dynamic howling suppressor 312 is active, the mixer 352 mixes the transmit ultrasonic stream 350 with an audio stream 354 received from the Push-to-talk voice over IP client 308, along with other audio signals (not shown) to generate a combined audio stream 356.

To implement automated howling suppression, ultrasonic signals may need to be produced at volume levels differing from the volume level currently set for audible (voice) output. To enable separate gain controls for howling suppression, the audio flinger 310 splits the combined audio stream 356 into two identical combined audio streams. The first combined audio stream 358 is passed through a low pass filter 359, which extracts the audio stream 354. The second combined audio stream 360 is passed through a high pass filter 361, which extracts the transmit ultrasonic stream 350. The audio flinger 310 adjusts the gain of the extracted audio stream 354 (for example, based on the general volume control 362 of the first communication device 105) to generate an adjusted audio stream 364. In some embodiments, the audio flinger 310 adjusts the gain of the transmit ultrasonic stream 350 using gain control 366 (for example, based on control signals received from the dynamic howling suppressor 312) to generate an adjusted transmit ultrasonic stream 368. The audio flinger 310 includes a mixer 370 that mixes the adjusted audio stream 364 and the adjusted transmit ultrasonic stream 368 to create an output audio stream 372, which is passed to the audio hardware abstraction layer 314.

Figure 4:
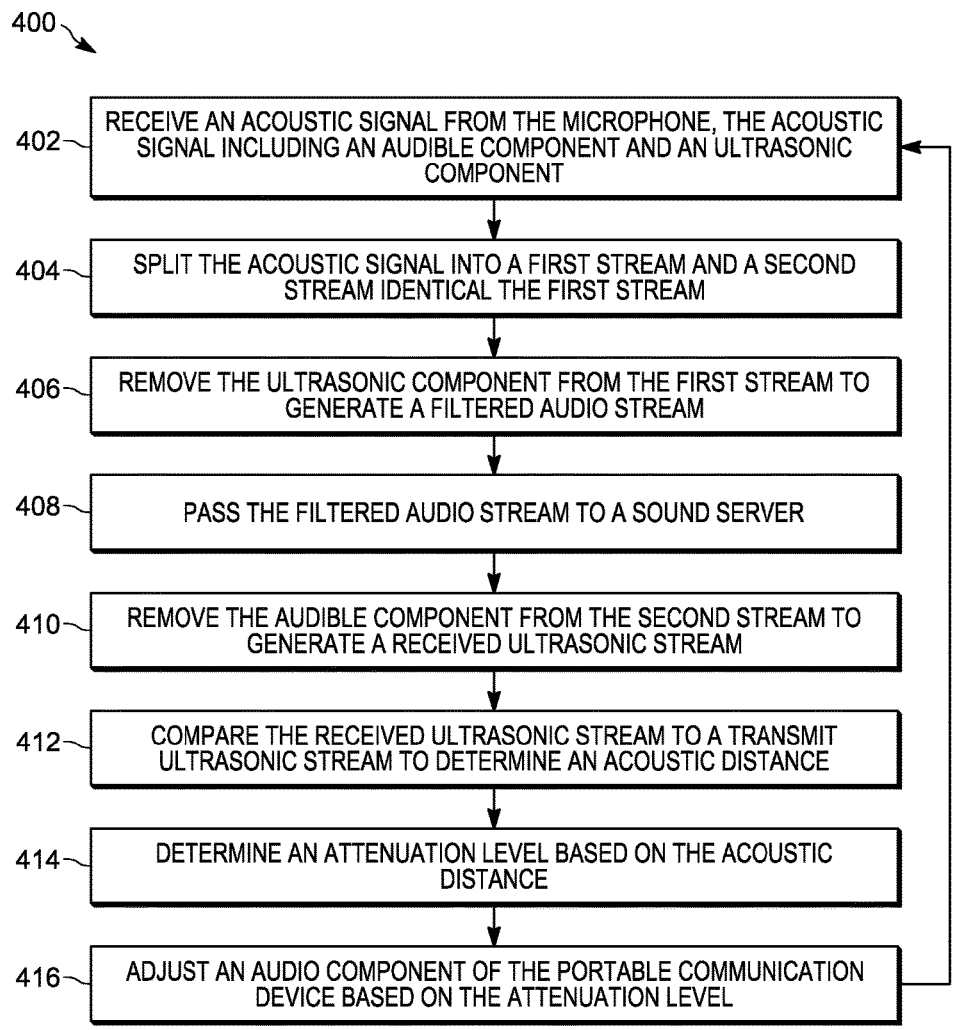
FIG. 4 is a flowchart illustrating a method of operating the communication device of FIG. 2, in accordance with some embodiments.

FIG. 4 illustrates an example method 400 for operating the first communication device 105 to suppress howling. The method 400 is described with respect to FIGS. 2 and 3. The method 400 is described as being performed by the first communication device 105 and, in particular, the electronic processor 205. However, it should be understood that in some embodiments, portions of the method 400 may be performed by other devices, including for example, the second communication device 110 or another device included in the communication system 100. For ease of description, portions of the method 400 are described in terms of a single howling source. It should be understood that embodiments of the method 400 may be used to identify and suppress multiple howling sources.

At block 402, the electronic processor 205 receives an acoustic signal (for example, the acoustic signal 320) from the microphone 235. The electronic processor 205 receives the acoustic signal 320 from the microphone 235 via the audio hardware abstraction layer 314. The acoustic signal 320 is picked up from the audio emitted by the loudspeaker of a nearby communication device (for example, the second communication device 110). The acoustic signal 320 includes an audible component, which is produced from radio signals received from the first communication device 105 while it is transmitting a push-to-talk voice communication. The acoustic signal 320 also includes an ultrasonic component, for example, produced by the device emitting the acoustic signal.

At block 404, the electronic processor 205 splits the acoustic signal 320 into a first stream 322 and a second stream 326, which is identical to the first stream 322.

At block 406, the electronic processor 205 removes the ultrasonic component from the first stream 322 to generate a filtered audio stream 325, for example, by passing the first stream 322 through the low pass filter 324.

At block 408, the electronic processor 205 passes the filtered audio stream 325 to a sound server (for example, the audio flinger 310).

At block 410, the electronic processor 205 removes the audible component from the second stream 326 to generate a received ultrasonic stream 329. In some embodiments, the electronic processor 205 removes the audible component from the second stream 326 by passing the second stream 326 through the high pass filter 328. In some embodiments, the electronic processor 205 adjusts the gain of the second stream 326 based on a predefined input gain (for example, received from the dynamic howling suppressor 312) to generate an adjusted second stream. In such embodiments, the electronic processor 205 removes the audible component from the adjusted second stream to generate the received ultrasonic stream 329. In some embodiments, the predefined input gain is set by the dynamic howling suppressor 312 based on, for example, whether the microphone 235 is internal or external to the first communication device 105.

At block 412, the dynamic howling suppressor 312 compares the received ultrasonic stream 329 to the transmit ultrasonic stream 350 to determine an acoustic distance. At block 414, the dynamic howling suppressor 312 determines an attenuation level based on the acoustic distance.

At block 416, the electronic processor 205 adjusts an audio component of the first portable communication device 105 based on the attenuation level. For example, the electronic processor 205 may adjust the volume of the loudspeaker 240 or the sensitivity of the microphone 235.

Figure 5:
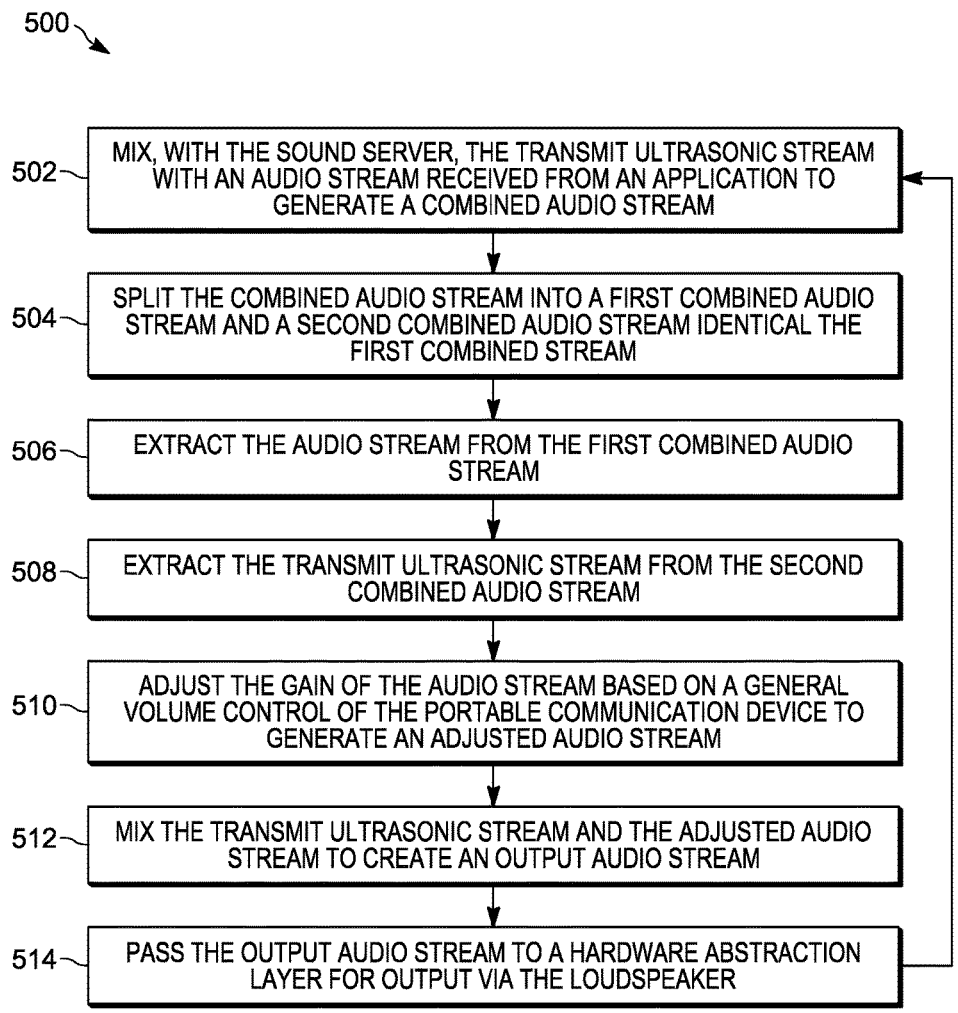
FIG. 5 is a flowchart illustrating a method of operating the communication device of FIG. 2, in accordance with some embodiments.

As noted herein, automated howling suppression may involve the transmission of ultrasonic signals from communication devices. FIG. 5 illustrates an example method 500 for operating the first communication device 105 to emit ultrasonic signals used to identify and suppress howling. The method 500 is described with respect to FIGS. 2 and 3. The method 500 is described as being performed by the first communication device 105 and, in particular, the electronic processor 205. However, it should be understood that in some embodiments, portions of the method 500 may be performed by other devices, including for example, the second communication device 110 or another device included in the communication system 100. For ease of description, portions of the method 500 are described in terms of a single howling source. It should be understood that embodiments of the method 500 may be used to identify and suppress multiple howling sources.

At block 502, the electronic processor 205 mixes (for example, with the mixer 352 of the audio flinger 310) the transmit ultrasonic stream 350 with the audio stream 354 received from an application (for example, the Push-to-talk voice over IP client 308) to generate the combined audio stream 356.

At block 504, the electronic processor 205 splits the combined audio stream 356 into a first combined audio stream 358 and a second combined audio stream 360, which is identical the first combined audio stream 358.

At block 506, the electronic processor 205 extracts the audio stream 354 from the first combined audio stream 358, for example, by passing the first combined audio stream 358 through the low pass filter 359.

At block 508, the electronic processor 205 extracts the transmit ultrasonic stream 350 from the second combined audio stream 360, for example, by passing the second combined audio stream 360 through the high pass filter 361.

At block 510, the electronic processor 205 adjusts the gain of the audio stream 354 (for example, based on a general volume control 362 of the first portable communication device 105) to generate an adjusted audio stream 364.

At block 512, the electronic processor 205 adjusts the gain of the transmit ultrasonic stream 350 based on a predefined output gain (for example, received from the dynamic howling suppressor 312) to generate an adjusted transmit ultrasonic stream 368. In some embodiments, the predefined output gain is set by the dynamic howling suppressor 312 based on, for example, whether the loudspeaker 240 is internal or external to the first communication device 105.

At block 514, the electronic processor 205 mixes (for example, using the mixer 370) the adjusted transmit ultrasonic stream 368 and the adjusted audio stream 364 to create an output audio stream (for example, the output audio stream 372).

At block 516, the electronic processor 205 passes the output audio stream 372 to the audio hardware abstraction layer 314 for output via the loudspeaker 240.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a," "has . . . a," "includes . . . a," or "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about" or any other version thereof, are defined as being close to as understood by one of ordinary skill in the art, and in one non-limiting embodiment the term is defined to be within 20%, in another embodiment within 10%, in another embodiment within 2% and in another embodiment within 1%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A portable communication device comprising:
 a microphone;
 a loudspeaker; and
 an electronic processor coupled to the microphone and the loudspeaker, and configured to
  receive an acoustic signal from the microphone, the acoustic signal including an audible component and an ultrasonic component;
  split the acoustic signal into a first stream and a second stream identical to the first stream;
  remove the ultrasonic component from the first stream to generate a filtered audio stream;
  pass the filtered audio stream to a sound server;
  remove the audible component from the second stream to generate a received ultrasonic stream;
  compare the received ultrasonic stream to a transmit ultrasonic stream to determine an acoustic distance;
  determine an attenuation level based on the acoustic distance; and
  adjust an audio component of the portable communication device based on the attenuation level.

2. The portable communication device of claim 1, further comprising:

a hardware abstraction layer coupled to the electronic processor and the microphone;
wherein the electronic processor is further configured to receive the acoustic signal from the microphone via the hardware abstraction layer.

3. The portable communication device of claim 1, wherein the electronic processor is further configured to:
adjust the gain of the second stream based on a predefined input gain to generate an adjusted second stream; and
remove the audible component from the second stream to generate a received ultrasonic stream by removing the audible component from the adjusted second stream.

4. The portable communication device of claim 1, wherein the electronic processor is further configured to remove the ultrasonic component from the first stream to generate a filtered audio stream by passing the first stream through a low pass filter.

5. The portable communication device of claim 1, wherein the electronic processor is further configured to remove the audible component from the second stream to generate a received ultrasonic stream by passing the second stream through a high pass filter.

6. The portable communication device of claim 1, wherein the electronic processor is further configured to pass the filtered audio stream to a sound server of the portable communication device by passing the filtered audio stream to an audio flinger of the portable communication device.

7. The portable communication device of claim 1, wherein the electronic processor is further configured to adjust an audio component of the portable communication device by adjusting at least one of the group consisting of a loudspeaker volume and a microphone sensitivity.

8. The portable communication device of claim 1, wherein the electronic processor is further configured to:
mix, with the sound server, the transmit ultrasonic stream with an audio stream received from an application to generate a combined audio stream;
split the combined audio stream into a first combined audio stream and a second combined audio stream identical to the first combined audio stream;
extract the audio stream from the first combined audio stream;
extract the transmit ultrasonic stream from the second combined audio stream;
adjust the gain of the audio stream based on a general volume control of the portable communication device to generate an adjusted audio stream;
mix the transmit ultrasonic stream and the adjusted audio stream to create an output audio stream; and
pass the output audio stream to a hardware abstraction layer for output via the loudspeaker.

9. The portable communication device of claim 8, wherein the electronic processor is further configured to:
adjust the gain of the transmit ultrasonic stream based on a predefined output gain to generate an adjusted transmit ultrasonic stream; and
create the output audio stream by mixing the adjusted transmit ultrasonic stream and the adjusted audio stream.

10. A method for providing acoustic feedback suppression in a portable communication device, the method comprising:
receiving an acoustic signal from a microphone of the portable communication device, the acoustic signal including an audible component and an ultrasonic component;
splitting, with an electronic processor, the acoustic signal into a first stream and a second stream identical to the first stream;
removing the ultrasonic component from the first stream to generate a filtered audio stream;
passing the filtered audio stream to a sound server of the portable communication device;
removing the audible component from the second stream to generate a received ultrasonic stream;
comparing the received ultrasonic stream to a transmit ultrasonic stream to determine an acoustic distance;
determining an attenuation level based on the acoustic distance; and
adjusting an audio component of the portable communication device based on the attenuation level.

11. The method of claim 10, wherein receiving an acoustic signal from a microphone of the portable communication device includes receiving an acoustic signal at a hardware abstraction layer of the portable communication device.

12. The method of claim 10, further comprising:
adjusting the gain of the second stream based on a predefined input gain to generate an adjusted second stream;
wherein removing the audible component from the second stream to generate a received ultrasonic stream includes removing the audible component from the adjusted second stream.

13. The method of claim 10, wherein removing the ultrasonic component from the first stream to generate a filtered audio stream includes passing the first stream through a low pass filter.

14. The method of claim 10, wherein removing the audible component from the second stream to generate a received ultrasonic stream includes passing the second stream through a high pass filter.

15. The method of claim 10, wherein passing the filtered audio stream to a sound server of the portable communication device includes passing the filtered audio stream to an audio flinger of the portable communication device.

16. The method of claim 10, wherein adjusting an audio component of the portable communication device includes adjusting at least one of the group consisting of a loudspeaker volume and a microphone sensitivity.

17. The method of claim 10, further comprising:
mixing, with the sound server, the transmit ultrasonic stream with an audio stream received from an application to generate a combined audio stream;
splitting the combined audio stream into a first combined audio stream and a second combined audio stream identical to the first combined audio stream;
extracting the audio stream from the first combined audio stream;
extracting the transmit ultrasonic stream from the second combined audio stream;
adjusting the gain of the audio stream based on a general volume control of the portable communication device to generate an adjusted audio stream;
mixing the transmit ultrasonic stream and the adjusted audio stream to create an output audio stream; and
passing the output audio stream to a hardware abstraction layer for output via a loudspeaker of the portable communication device.

18. The method of claim 17, further comprising:
adjusting the gain of the transmit ultrasonic stream based on a predefined output gain to generate an adjusted transmit ultrasonic stream;

wherein creating the output audio stream includes mixing the adjusted transmit ultrasonic stream and the adjusted audio stream.

\* \* \* \* \*